United States Patent
Loppacher

(10) Patent No.: US 7,394,171 B2
(45) Date of Patent: Jul. 1, 2008

(54) SUPPORTING FLUE STRUCTURE FOR AN ELECTRICAL PULSE GENERATOR

(75) Inventor: Matthias Loppacher, Basel (CH)

(73) Assignee: Haefely Test AG, Basel (CH)

( * ) Notice: Subject to any disclaimer, the term of this patent is extended or adjusted under 35 U.S.C. 154(b) by 372 days.

(21) Appl. No.: 10/451,165

(22) PCT Filed: Dec. 20, 2000

(86) PCT No.: PCT/IB00/01945

§ 371 (c)(1),
(2), (4) Date: Aug. 4, 2003

(87) PCT Pub. No.: WO02/51007

PCT Pub. Date: Jun. 27, 2002

(65) Prior Publication Data

US 2004/0046459 A1    Mar. 11, 2004

(51) Int. Cl.
*H03K 3/00* (2006.01)
*H03K 3/64* (2006.01)

(52) U.S. Cl. .................................... 307/106
(58) Field of Classification Search ................ 307/106
See application file for complete search history.

(56) References Cited

U.S. PATENT DOCUMENTS

| | | | |
|---|---|---|---|
| 3,248,574 A | | 4/1966 | Dyke |
| 3,501,646 A | * | 3/1970 | Bishop ................ 307/110 |
| 3,768,313 A | * | 10/1973 | Johansson et al. ...... 73/866 |
| 5,798,579 A | * | 8/1998 | McPhee ................ 307/106 |
| 6,349,587 B1 | * | 2/2002 | Mani et al. ............. 73/9 |

FOREIGN PATENT DOCUMENTS

| | | |
|---|---|---|
| CH | 1 049 495 | 1/1959 |
| DE | 35 16 153 C2 | 9/1988 |

OTHER PUBLICATIONS

International Search Report for PCT/IB00/01945, dated Aug. 20, 2001, 3 pages.

* cited by examiner

*Primary Examiner*—Michael J Sherry
*Assistant Examiner*—Dru M Parries
(74) *Attorney, Agent, or Firm*—Frishauf, Holtz, Goodman & Chick, P.C.

(57) ABSTRACT

A integrated flue support construction (2) for a Marx impulse voltage generator (2) with several generator stages (3) is disclosed. It has been known to arrange a flue (2) for flushing the air of switching spark gaps (4) separately from a support frame for the switching spark gaps (4), the impulse capacitors (5) and series and parallel resistors (7, 8). According to the invention, the flue (2) has a supporting function for the switching spark gaps (4) and individual or all electrical components (5-10) of the impulse circuit. In one embodiment the flue (2) consists of a triangular cylinder support structure (2), wherein the side walls (11) are formed by insulating plates (11), each receiving one of the electrical components, namely the switching spark gap (4), impulse capacitor (5) and resistors (7, 8). Advantages of the invention are: a less complicated construction and a saving of costs, a more compact design with smaller flue cross section area (22) and thereby smaller self-inductance of the impulse circuit as well as easier production, transportability and handling because of stacked modules (14) each with at least one generator stage (3).

21 Claims, 2 Drawing Sheets

SUPPORTING FLUE STRUCTURE FOR AN ELECTRICAL PULSE GENERATOR

This application is a U.S. National Phase Application under 35 USC 371 of International Application PCT/IB00/01945 filed Dec. 20, 2000.

TECHNICAL FIELD

The invention lies in the field of high voltage engineering, and relates to an electrical impulse generator for generating high impulse voltages or impulse currents, comprising a flue formed by a support structure for at least one chargeable generator stage, which comprises a switching spark gap for generating electrical discharges in a gaseous medium and further electrical components for charging and/or discharging the generator stage, wherein the switching spark gap is arranged in the flue with a defined gas exchange for controlling and/or keeping constant a dielectric strength of the gaseous medium.

STATE OF THE ART

In a Marx impulse voltage generator several generator stages are held on top of each other in the shape of a tower by a support frame. The support frame is typically made from individual insulating tubes of hard paper or glass fiber reinforced plastics and may comprise, for improved mechanical stability, struts, a steel frame, intermediate platforms, lateral restraints with glass fiber cables or such. The generator stages are charged in a parallel circuit and discharged in a series circuit by Deans of a switching member, in general a switching spark gap. In particular for higher impulse voltages, for the generation of which a plurality of switching members is required, spontaneous undesired switching must be expected when using sphere discharge gaps in free air. A reduction of the dielectric strength and a spontaneous discharge of the discharge gaps can be caused by contamination of the air, e.g. due to dust deposits, floating particles, burn-off or the formation of ozone from previous discharges. This problem has, so far, been solved by a common or individual housing of the discharge gaps and by leading filtered air through the housing.

A common housing is e.g. implemented by the company Highvolt in Dresden by constructing a flue arranged separately and laterally from the support structure, which encloses the switching discharge gaps arranged on top of each other and has an air inlet opening with a ventilator at its bottom end and an air outlet opening it its top end. The flue can be designed as a insulating tube and may be provided with viewing windows for the spark discharge gaps. The additional construction effort and costs are disadvantageous. On the one hand, the support structure of the impulse voltage generator must be designed for additionally holding the flue. On the other hand, the spark discharge gaps must be located, in comparison, separately from the other components of the impulse generator in order to guarantee sufficient insulation spacings between the wall of the flue and the spark discharge gaps. The area enclosed by the discharge circuit is thereby increased and the switching performance is impaired by increased self-inductance.

An individual housing of each separate discharge gap is e.g. realized by the company Passoni & Villa. Each housing is fed individually with filtered air and an air exchange is achieved due to leaks. The room required for housing each generator stage as well as the feeding tubes for pressurized air cause again a substantial additional effort.

SUMMARY OF THE INVENTION

It is an object of the invention to provide an improved electrical impulse generator where spontaneous discharges of the discharge gaps are suppressed with small additional effort.

The solution according to the invention consists in an electrical impulse generator, in particular suited for generating high impulse voltages or impulse currents, which comprises a support frame for at least one chargeable generator stage, which comprises a switching discharge gap for generating electrical discharges in a gaseous medium and further electrical components for charging and/or discharging the generator stage, wherein the switching discharge gap is arranged in a flue with a defined gas exchange for controlling and/or keeping constant the dielectric strength of the gaseous medium, wherein further the flue is designed as a support structure and the support structure has a supporting function for the switching spark gap and for at least one of the electrical components of the at least one chargeable generator stage. By the integration of supporting functions into the flue, the constructive effort required for a conventional support structure can be reduced or eliminated. This allows substantial savings of costs.

In one embodiment, the flue has a supporting function for at least one impulse capacitor and/or at least one series resistor, parallel resistor, charge resistor and/or potential resistor of the at least one chargeable generator stage, In particular, the flue forms the supporting frame for all generator stages of the impulse generator.

In another embodiment, the flue is an insulating tube with a polygonal or round cross section and the electrical components of each generator stage, in particular an impulse capacitor, a series resistor and a parallel resistor, can be attached to the side walls of the insulating tube. In this manner, an interior flue is created and a very simple and compact construction of the impulse generator is achieved.

In a further embodiment, the insulating tube has a small cross section area for creating a low inductance spark current circuit with a small enclosed area. By the integrated flue and support structure it is in fact possible to lower the inductance of the discharge circuit to values that have so far been unknown for housed impulse generators, and the electrical switching characteristics can correspondingly be improved. Advantageously, the insulating tube is designed to be assembled from modules that can be stacked on top of each other, wherein the modules comprise at least one generator stage, preferably two, three or four generator stages. The modular construction makes an efficient prefabrication at the factory possible, as well as a fast and easy final assembly at the customer. The impulse generator can be adapted to different desired high voltage or high current values quickly and flexibly by adding or removing modules. The modularity is therefore also of great advantage to the user during operation.

In a further embodiment, the flue is built from insulating plates assembled into a triangular cylinder assembly, and each side wall comprises mounting holes either for mounting the spark discharge gap, or an impulse capacitor or two mounting arms for receiving a series resistor and a parallel resistor, respectively. The triangular cylinder construction can be manufactured easily and has a very small enclosed induction area of the discharge circuit.

Further embodiments, advantages and applications of the invention result from the dependent claims as well as from the now following description, which makes reference to the figures.

BRIEF DESCRIPTION OF THE DRAWINGS

In the figures, similar parts are designated with the same reference numerals.

DETAILED DESCRIPTION OF THE INVENTION

Figure 1:
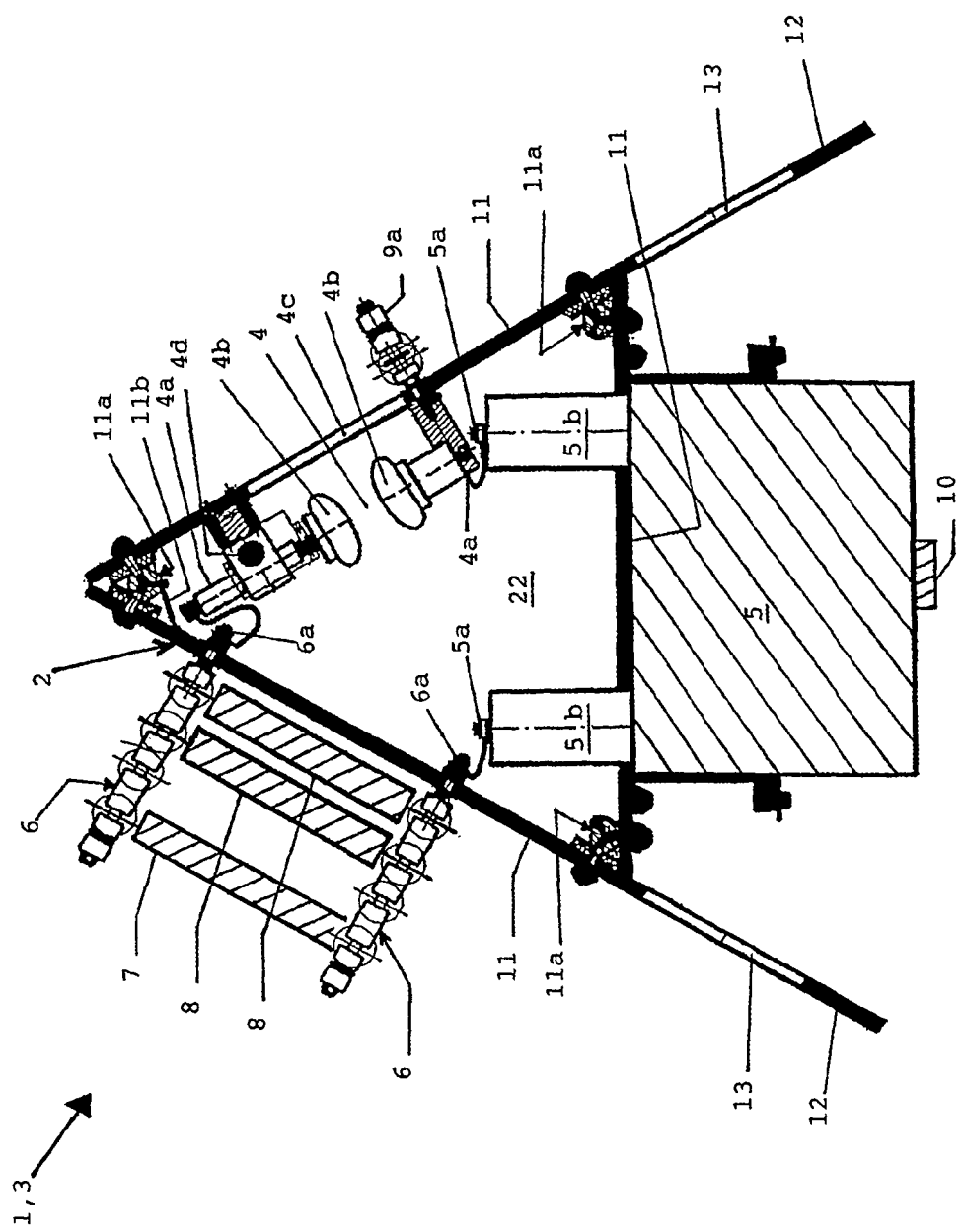
FIG. 1 shows a supporting flue structure according to the invention for an impulse generator in cross section.

FIG. 1 shows the cross section of a generator stage 3 of an electrical impulse generator 1 and in particular of a Marx impulse generator 1 for generating pulse shaped high voltages. In the shown generator stage 3 there are illustrated a switching spark gap 4, an impulse capacitor 5 and mounting arms 6 for snapping in at least one parallel resistor 8 into generator stage 3 and at least one series resistor 7 between two generator stages 3 arranged on top of each other. Switching spark gap 4 comprises two discharge electrodes 4b, which are typically rounded. The commonly known principle of operation is based on charging the at least one impulse capacitor 5 in several generator stages 3 in parallel via charge resistors 9 and on discharging the capacitors via the series resistors 7 and the parallel resistors 8 in a series circuit in pulsed manner. In a manner that is, per se, known, the series resistors 7, also called front or damping resistors 7, serve to control the impulse rise times and the parallel resistors 8 serve to control the impulse decay times. Potential resistors 9 can be present for achieving a more homogenous voltage distribution and/or for safely removing residual charges of the housings of the impulse capacitors 5. Impulse capacitor 5 comprises lead-throughs 5b for its high voltage terminals 5a, which are typically designed for 100 or 200 kV at each generator stage 3. The terminals 5a are connected to the terminals 4a of the switching spark gaps and the support arms 6 of the resistors 7, 8 in high voltage proof manner by means of cable connections or such of minimum length. The side walls 11 form a support structure 2 for switching spark gap 4 and the electrical components 5-10 of generator stage 3. In addition to this, the side walls 11 form a laterally enclosed space 22, which serves as a flue 2 for exchanging air for switching spark gap 4 located inside flue 2. Air, dried air or another fluid, such as a protective gas, can be led through flue 2 in order to keep the dielectric strength of switching spark gap 4 constant or to increase it as compared to environmental air. In particular, particles floating in air, dust, burn-off or ozone of previous discharge processes are flushed out of the regions of the switching spark gaps 4 by means of flue 2. Flue 2 according to the invention therefore combines the function of a controlled air exchange and the support function for the electrical components 5-10.

In the embodiment of FIG. 1, a particularly compact design is achieved by a triangular cylindrical flue support structure 2. The triangular shape 2 corresponds to a close or even minimum distance of switching discharge gap 4, an impulse capacitor 5 and the resistors 7, 8, wherein the flat side walls 11 are especially suited for a simple mounting of the electrical components 5-9. Other polygonal flue cross sections 2 are possible as well and may e.g. be useful if several impulse capacitors 5 per generator stage 3 or additional auxiliary spark gaps (not shown) are present. Advantageously, in each generator stage 3, an impulse capacitor 5, a series resistor 7, a parallel resistor 8 and/or a discharge resistor 9 are arranged outside flue 2 and comprise contacts or lead-throughs 5b into the interior of flue 22. In this manner, the electrical components 5-9 and in particular the resistors 7-9 can be exchanged very easily and are well visible from the outside. In particular, the value of the resistors can by checked due to a characteristic coloring. A drive 4d for adjusting the switching spark gaps 4 can be arranged in flue 2. Flue 2 can be provided with viewing windows 4c for the witching spark gaps 4, which serve, in a per-se known manner, for visual control and, where applicable, for an optical synchronization and thereby easier firing of the air in switching spark gap 4. By means of the presented triangular cylinder design 2 a pulse wave or discharge current circuit of very small cross section or enclosed section 22 and therefore low self induction can be achieved.

With the integration flue support structure 2 with an internal flue interior 22 a support structure 2 is created that is very stable, compact, easy to manufacture and easy to handle, for several or all generator stages 3 of an impulse generator 1. Impulse generator 1 can also be an impulse current generator 1 built in similar manner. Conventional support structures with support tubes and steel frame or intermediate connecting plates for laterally mounting the support tubes can therefore be simplified or, as shown, be dispensed with completely. The flue support structure 2 can, where applicable, be further laterally stabilized by lateral bracing with glass fiber cables or such.

In the given embodiment the triangular cylinder construction 2, i.e. the tube or hollow cylinder 2 with triangular cross section, is built from insulating plates forming the side walls 11, which comprise mounting holes for mounting the electrical components 4-9. The insulating plates 11 are joined by metallic bracket members 11a contacting adjacent terminals 4a, 5a, 6a of the electrical components 4-9 via leads 11b or similar. Two side walls 11 of the triangular cylinder construction 2 comprise, in the region of the impulse capacitor 5, projecting parts 12, each having at least one support hole 13. In particular, a connecting line through the support holes 13 runs substantially through a center of mass of the impulse generator 1 such that the impulse generator 1 or an individual generator module 14 can be lifted and transported very easily and without lateral tiling by means of a lifting tool engaging the support holes.

Figure 2:
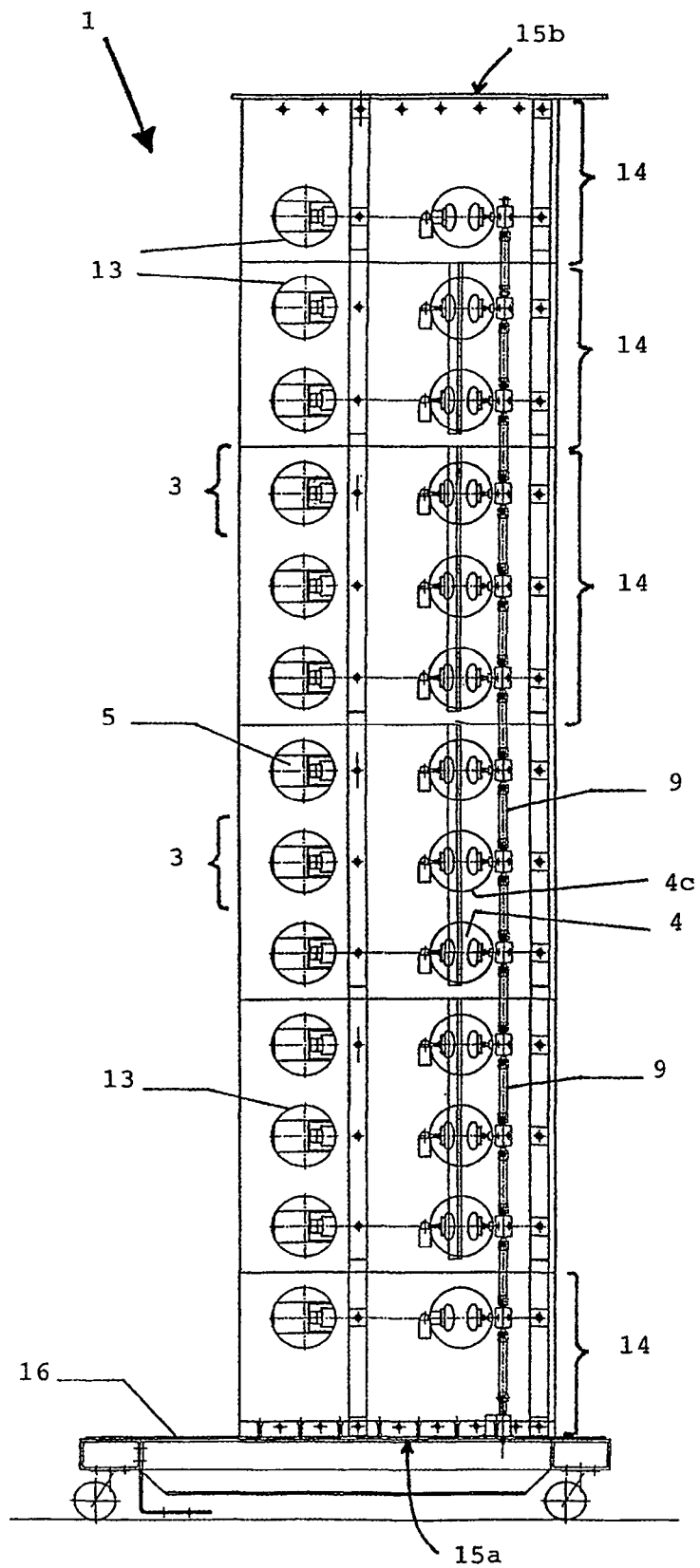
FIG. 2 shows the flue structure of FIG. 1 in a side view.

FIG. 2 shows the flue support structure 2 in a lateral view. The triangular, polygonal or round insulating tube 11 is shown to be assembled from modules 14 stacked on top of each other. In the case of triangular cylinder modules 14, for example, stackability can be implemented by providing the cylinder modules 14 with projecting centering members (not shown) arranged in staggered relation to a side wall 11, in particular by centering pins glued or mounted to the bracket members 11a. In general, a centering frame for stacking the cylindrical modules 14 can be present as well. Each module 14 comprises at lest one generator stage 3 and preferably two, three or four generator stages 3. Cylinder modules 14 can also be used with arbitrary other flue cross section geometries. The bottommost module 14 should have an air entry opening 15a with a ventilator and the topmost module 14 an air exit opening 15b. Air entry and air exit can also be exchanged. The support structure and the flue 2, in particular a flue 2 forming the support structure, can also be mounted on a displaceable frame 16, in particular on a wheeled vehicle or an air-cushioned vehicle.

The invention claimed is:

1. An electrical impulse generator for generating high impulse voltages or impulse currents, comprising:

a flue formed by a support structure for at least one chargeable generator stage, which comprises a switching spark gap for generating electrical discharges in a gaseous medium and further electrical components for charging and/or discharging the generator stage, wherein the switching spark gap is arranged in the flue with a defined gas exchange for controlling and/or keeping constant a dielectric strength of the gaseous medium, wherein the support structure has a supporting function for the switching spark gap and for at least one of the electrical components of the at least one chargeable generator stage, and wherein the support structure comprises an insulating tube formed by a plurality of side walls so as to have a polygonal or round cross section, wherein an impulse capacitor, a series resistor, a parallel resistor and a charge resistor are arranged, for each generator stage, outside the flue on an outer side of the side walls of the insulating tube, wherein the flue further comprises contacts or lead-throughs into an interior of the flue, wherein each of the side walls comprises mounting holes for either mounting one of: the switching spark gap, the impulse capacitor, and two mounting arms for receiving the series resistor and the parallel resistor, and wherein two of the side walls of the insulating tube comprise projecting parts, wherein the impulse capacitor of each stage is arranged between said projecting parts, and wherein each projecting part has at least one support hole adjacent to said impulse capacitor.

2. The electrical impulse generator of claim 1, wherein a connecting line through the support holes runs substantially through a center of mass of the impulse generator.

3. The electrical impulse generator of claim 1, wherein the side walls of the insulating tube comprise insulating plates assembled into a triangular cylinder assembly.

4. The electrical impulse generator of claim 2, wherein the side walls of the insulating tube comprise insulating plates assembled into a triangular cylinder assembly.

5. The electrical impulse generator of claim 1, wherein the insulating tube comprises modules stackable on top of each other, each module comprising at least one generator stage.

6. The electrical impulse generator of claim 1, wherein terminals of the switching spark gap, the impulse capacitor, the series resistor and the parallel resistor are arranged inside the flue.

7. The electrical impulse generator of claim 1, wherein the side walls of the insulating tube comprise insulating plates linked by metallic bracket members contacting adjacent terminals of the switching spark gap and the electrical components.

8. The electrical impulse generator of claim 1, wherein the flue comprises viewing windows for the switching spark gaps.

9. The electrical impulse generator of claim 1, wherein the flue comprises at a first end an air input opening with a ventilator and at a second end an air outlet opening.

10. The electrical impulse generator of claim 1, wherein a plurality of generator stages are provided, and the flue supports all generator stages of the impulse generator.

11. The electrical impulse generator of claim 1, wherein the insulating tube comprises a plurality of stackable modules, each module carrying two to four generator stages.

12. The electrical impulse generator of claim 1, wherein the flue comprises a plurality of modules stacked on top of each other, each module being formed by a plurality of insulating plates and carrying at least one generator stage, and wherein each module comprises projecting centering members in staggered relation to the insulating plates.

13. The electrical impulse generator of claim 1, wherein the flue comprises a plurality of modules stacked on top of each other, each module being formed by a plurality of insulating plates and carrying at least one generator stage, and wherein each module comprises a centering frame for stacking the modules.

14. The electrical impulse generator of claim 1, further comprising a drive for the switching spark gap, the drive being arranged in the flue.

15. The electrical impulse generator of claim 1, further comprising further spark gaps in addition to the switching spark gap, and wherein said further spark gaps are also arranged in the flue.

16. The electrical impulse generator of claim 1, wherein the support structure and the flue are arranged on a displaceable vehicle.

17. The electrical impulse generator of claim 1, wherein the impulse generator comprises a Marx impulse voltage generator or an impulse current generator.

18. An electrical impulse generator for generating high impulse voltages or impulse currents, comprising:

a plurality of chargeable generator stages, each generator stage having a switching spark gap for generating electrical discharges in a gaseous medium for charging and/or discharging the generator stage, and an impulse capacitor, a flue formed by a plurality of side walls and having a polygonal or round interior space with a defined gas exchange for controlling and/or keeping constant a dielectric strength of the gaseous medium, wherein, of the side walls of the flue, first and second side walls comprise projecting parts extending over a third wall, wherein said switching spark gaps are supported by said flue and are arranged in said polygonal or round interior space, and wherein said impulse capacitors are supported by and arranged outside of said third side wall between said projections of said first and second side walls.

19. The electrical impulse generator of claim 18, wherein said projections comprise support holes adjacent to said impulse capacitors.

20. The electrical impulse generator of claim 18, wherein the flue is formed by the first, second and third side walls and has a triangular interior space.

21. The electrical impulse generator of claim 19, wherein the flue is formed by the first, second and third side walls and has a triangular interior space.

* * * * *